United States Patent
Fukazawa et al.

(10) Patent No.: US 9,343,297 B1
(45) Date of Patent: May 17, 2016

(54) METHOD FOR FORMING MULTI-ELEMENT THIN FILM CONSTITUTED BY AT LEAST FIVE ELEMENTS BY PEALD

(71) Applicant: ASM IP Holding B.V., Almere (NL)

(72) Inventors: Atsuki Fukazawa, Tokyo (JP); Hideaki Fukuda, Tokyo (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/693,138

(22) Filed: Apr. 22, 2015

(51) Int. Cl.
*H01L 21/00* (2006.01)
*H01L 21/02* (2006.01)

(52) U.S. Cl.
CPC ........ *H01L 21/0228* (2013.01); *H01L 21/0234* (2013.01); *H01L 21/02112* (2013.01); *H01L 21/02126* (2013.01); *H01L 21/02142* (2013.01); *H01L 21/02274* (2013.01); *H01L 21/02321* (2013.01); *H01L 21/02323* (2013.01); *H01L 21/02329* (2013.01)

(58) Field of Classification Search
CPC ................................................. H01L 21/02167
See application file for complete search history.

(56) References Cited

U.S. PATENT DOCUMENTS

| | | |
|---|---|---|
| 2009/0209081 A1 | 8/2009 | Matero et al. |
| 2012/0032311 A1* | 2/2012 | Gates ................ H01L 21/02126 257/635 |
| 2013/0084714 A1 | 4/2013 | Oka et al. |
| 2015/0021599 A1* | 1/2015 | Ridgeway ............. C23C 16/345 257/43 |

* cited by examiner

*Primary Examiner* — Zandra Smith
*Assistant Examiner* — Andre' C Stevenson
(74) *Attorney, Agent, or Firm* — Snell & Wilmer LLP

(57) ABSTRACT

A single-phase multi-element film constituted by at least four elements is formed on a substrate by plasma-enhanced atomic layer deposition (PEALD) conducting one or more process cycles. Each process cycle includes: (i) forming an integrated multi-element layer constituted by at least three elements on a substrate by PEALD using at least one precursor; and (ii) treating a surface of the integrated multi-element layer with a reactive oxygen, nitrogen, and/or carbon in the absence of a precursor for film formation so as to incorporate at least one new additional element selected from oxygen, nitrogen, and carbon into the integrated multi-element layer.

20 Claims, 6 Drawing Sheets

METHOD FOR FORMING MULTI-ELEMENT THIN FILM CONSTITUTED BY AT LEAST FIVE ELEMENTS BY PEALD

BACKGROUND

1. Field of the Invention

The present invention relates generally to a method forming a single-phase multi-element film constituted by at least four elements on a substrate by plasma-enhanced atomic layer deposition (PEALD).

2. Related Art

Copper wiring has been used for logic devices, and dielectric films have been applied for copper wiring, which films are deposited by chemical vapor deposition (CVD) or spin-on dielectric (SOD). For example, a Cu-cap film used as a diffusion blocking film for copper is constituted by a dielectric material such as SiN. As miniaturization of devices progresses, a dielectric film having a dielectric coefficient (k value) as low as 5 or less is required. However, for a layer structure formed by damascene methods, such a dielectric film need not have a good step coverage or conformality. However, depending on the type of layer structure formed by, e.g., deposition and etching, a dielectric film is required to have a good step coverage or conformality as well as a good resistance to chemicals, in addition to a low dielectric constant. It is difficult to deposit a dielectric film having the above properties by CVD.

From the above viewpoints, a dielectric film is deposited by atomic layer deposition (ALD) which is suitable for depositing a film having a good step coverage, particularly by plasma-enhanced ALD (PEALD), rather than thermal ALD, in consideration of potential damage caused to films due to heat. Further, since a two-element film such as SiN may not have sufficient etch selectivity and good dielectric constant, a multi-element dielectric film consisting of more than two elements is under development. However, it is not easy to deposit a high-quality multi-element dielectric film by ALD, since ALD using multiple elements involves problems such as interference with adsorption of one gas by adsorption of another gas.

Any discussion of problems and solutions in relation to the related art has been included in this disclosure solely for the purposes of providing a context for the present invention, and should not be taken as an admission that any or all of the discussion was known at the time the invention was made.

SUMMARY

In some embodiments, a single-phase multi-element film constituted by at least four elements is formed on a substrate by plasma-enhanced atomic layer deposition (PEALD), wherein the composition of a deposited film by PEALD is adjusted or manipulated by a post-deposition cycle which is conducted after a deposition cycle, in order to render the deposited film low in dielectric constant, high in step coverage, and/or high in wet etch resistance. The deposited film is suitably used as a protective film disposed around copper wiring, or as an insulation film for a gate in integrated circuits, where wiring delay is a problem. Since the deposited film has a low dielectric constant (typically less than 5), it can suppress wiring delay. By changing a process sequence, various types of multi-element films can be formed. In this disclosure, the term "single-phase" refers generally to a phase formed by a single ALD process constituted by one or more ALD process cycles each consisting essentially of deposition and one or more post-deposition cycles. The term "multi-element" refers generally to elements including at least one metalloid element or metal element and more than one other element, or to elements including more than two nonmetal elements. The "post-deposition cycle" refers generally to a non-deposition cycle conducted after a last deposition cycle in each ALD process cycle.

In some embodiments, the deposition cycle uses two or more precursors. In some embodiments, the post-deposition cycle comprises oxidizing, nitriding, and/or carbonizing the deposited layer, wherein the post-deposition cycle is conducted once or is repeated multiple times after the deposition cycle is conducted once or is repeated multiple times. In some embodiments, the single-phase multi-element film contains silicon or base metal constituting a main structure of its matrix and has a dielectric constant of 5.0 or less and good step coverage. In some embodiments, the single-phase multi-element film is constituted by SiBCNH, SiBOCNH, SiCNH, SiOCNH, SiOCH, SiPNH, or SiPOCNH. In some embodiments, the process temperature is in a range of 0° C. to 600° C.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 2 illustrates a PEALD process sequence according to a comparative example.

FIG. 3 illustrates a PEALD process sequence according to an embodiment of the present invention.

FIG. 4 illustrates a PEALD process sequence according to another embodiment of the present invention.

FIG. 5 illustrates a PEALD process sequence according to still another embodiment of the present invention.

FIG. 6 illustrates a PEALD process sequence according to yet another embodiment of the present invention.

DETAILED DESCRIPTION OF EMBODIMENTS

Figure 1A:
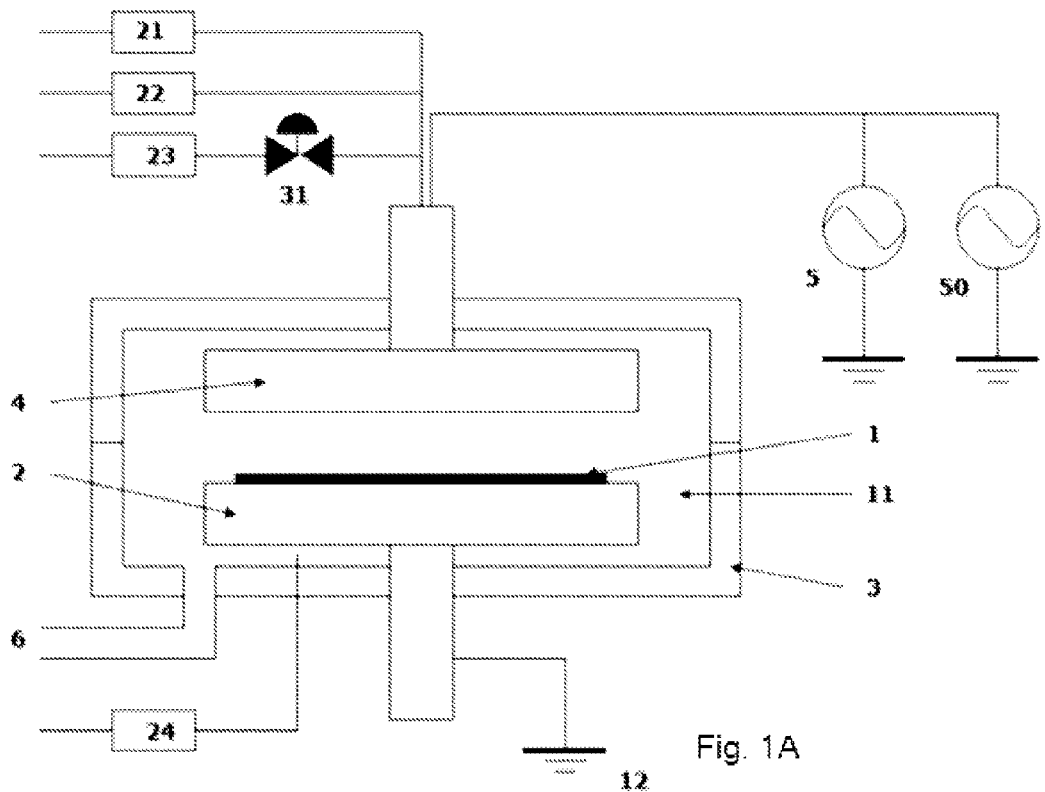
FIG. 1A is a schematic representation of a PEALD (plasma-enhanced atomic layer deposition) apparatus for depositing a dielectric film usable in an embodiment of the present invention.

In this disclosure, "gas" may include vaporized solid and/or liquid and may be constituted by a single gas or a mixture of gases. In this disclosure, a process gas introduced to a reaction chamber through a showerhead may be comprised of, consist essentially of, or consist of a precursor gas and an additive gas. The precursor gas and the additive gas are typically introduced as a mixed gas or separately to a reaction space. The precursor gas can be introduced with a carrier gas such as a noble gas. The additive gas may be comprised of, consist essentially of, or consist of a reactant gas and a dilution gas such as a noble gas. The reactant gas and the dilution gas may be introduced as a mixed gas or separately to the reaction space. A precursor may be comprised of two or more precursors, and a reactant gas may be comprised of two or more reactant gases. The precursor is a gas chemisorbed on a substrate and typically containing a metalloid or metal element which constitutes a main structure of a matrix of a dielectric film, and the reactant gas for deposition is a gas reacting with the precursor chemisorbed on a substrate when the gas is excited to fix an atomic layer or monolayer on the substrate. "Chemisorption" refers to chemical saturation adsorption. A gas other than the process gas, i.e., a gas introduced without passing through the showerhead, may be used for, e.g., sealing the reaction space, which includes a seal gas such as a noble gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

Further, in this disclosure, the article "a" or "an" refers to a species or a genus including multiple species unless specified otherwise. The terms "constituted by" and "having" refer independently to "typically or broadly comprising", "comprising", "consisting essentially of", or "consisting of" in some embodiments. Also, in this disclosure, any defined meanings do not necessarily exclude ordinary and customary meanings in some embodiments.

Additionally, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

Some embodiments provide a method for forming a single-phase multi-element film constituted by at least four elements on a substrate by plasma-enhanced atomic layer deposition (PEALD) conducting one or more process cycles, each process cycle comprising: (i) forming an integrated multi-element layer constituted by at least three elements on a substrate by PEALD using at least one precursor; and (ii) treating a surface of the integrated multi-element layer with a reactive oxygen, nitrogen, and/or carbon in the absence of a precursor for film formation so as to incorporate at least one new additional element selected from oxygen, nitrogen, and carbon into the integrated multi-element layer. The single-phase multi-element film may be constituted by four, five, six, or seven elements. In some embodiments, the multiple elements consist of at least one metalloid or base metal element for forming a main structure of a matrix of the film (e.g., Si, B, As, Al, etc.), and nonmetal elements (e.g., H, C, N, O, P, etc.), wherein the multiple elements may be SiBNH, SiBONH, SiBCNH, SiBOCNH, SiCNH, SiONH, SiOCNH, SiOCH, SiPNH, SiPOCNH, BCONH, AsCONH, BCNH, or AsCNH. In some embodiments, the multiple elements consist of nonmetal elements, wherein the multiple elements may be PCONH or PCNH. In this disclosure, "element" constitutes a part of a matrix of a film and may not include impurities, elements which are not expressed members of a chemical formula of the film, and elements included in the film in a negligible amounts or less than detectable amount. Thus, the film can include such impurities, negligible elements, and undetectable elements without being expressly so indicated. The detectable amount varies depending on the composition analysis method. For example, an element such as carbon in a film may not be detected by Rutherford backscattering Spectrometry (RBS) and Hydrogen Forward Scattering (HFS) if the content of carbon is 5 atomic % or less. However, Secondary Ion Mass Spectrometry (SIMS) may be able to detect such a low content of carbon. For example, a film which is considered to be a film of SiBNH according to RBS/HFS analysis may be a film of SiBCNH according to SIMS analysis. In this disclosure, unless otherwise specified, the chemical formula of a film is determined based on a composition analysis by RBS/HFS.

In some embodiments, the multiple elements include two or more metalloid elements, and in step (i), the multi-element layer is deposited using two or more precursors containing different metalloid elements. When two or more metalloid elements constitute the multiple elements, it is preferable to use two or more precursors each containing a different metalloid element, because by doing so, control over concentration of each metalloid element can easily and independently be accomplished, and a problem of adsorption interference can be avoided. If one precursor contains multiple metalloid elements in its molecule such as a precursor containing Si, B, C, N, and H, the concentrations of the metalloid elements (Si and B) cannot be controlled independently, and it may cause adsorption interference, e.g., lowering deposition rate.

In some embodiments, in step (i), the reactant gas for deposition contains hydrogen, nitrogen, carbon, and/or oxygen, and introduces such an element to the multi-element film. In some embodiments, in step (i), the reactant gas for deposition is a mixture of hydrogen gas and nitrogen gas, or $NH_3$, which introduces N and H to the multi-element film. Carbon and oxygen can be introduced into the multi-element film from the precursor and reactant for deposition in step (i), and/or reactant for surface treatment in step (ii).

In some embodiments, step (i) is conducted in each process cycle to the extent that a thickness of the integrated multi-element layer does not exceed 15 nm. In some embodiments, the thickness of the integrated multi-element layer in each process cycle is a thickness of one atomic layer (e.g., 0.2 nm) or more (e.g., 1.0 nm or more), but about 3 nm or less, about 5 nm or less, about 10 nm or less, about 15 nm or less, or in a range between any two foregoing numbers (typically 10 nm or less, preferably 5 nm or less, e.g., 2 to 5 nm). If the thickness of the integrated multi-element layer in each process cycle exceeds 10 nm or 15 nm, an additional element (or dopant) which is introduced into the multi-element film by step (ii) may not penetrate throughout the integrated multi-element layer formed in step (i) in a thickness direction, regardless of the duration of step (ii). In order to disperse the additional element or dopant uniformly throughout the multi-element layer, preferably, the thickness does not exceed 10 nm. Thus, in some embodiments, step (ii) is conducted in each process cycle to the extent that the at least one new additional element is diffused throughout the integrated multi-element layer.

In some embodiments, step (i) in each process cycle is constituted by a deposition cycle of PEALD, and step (ii) in each process cycle is constituted by a surface treatment cycle, wherein a cycle ratio of the number of the deposition cycles to the number of the surface treatment cycles in each process cycle is 1/10 to 100/1. In some embodiments, the cycle ratio is 1/1 to 60/1 (e.g., 2/1, 5/1, 10/1, 20/1, 30/1, 40/1, 50/1, or values between any two foregoing numbers, e.g., 10/1 to 30/1). In some embodiments, the surface treatment cycle is repeated fewer times than is the deposition cycle. In some embodiments, the surface treatment cycle is repeated more than once, where purging is conducted after each cycle, so that reaction by-products can be removed from the surface of the substrate, increasing efficiency of the surface reaction. Further, by conducting the surface treatment cycle multiple times, it becomes easier to adjust the compositions of the multi-element layer, and distributions of the additional element or dopant in a thickness direction. In some embodiments, the surface treatment cycle is repeated more often than is the deposition cycle. In some embodiments, the cycle ratio is 1/2 to 1/5.

In some embodiments, the number of process cycles is one to 1,000, or at least two, or 10 to 100, depending on the target thickness of a multi-element film.

In some embodiments, in step (ii), an additional element or dopant is introduced or doped into the multi-element layer obtained in step (i), which penetrates the multi-element layer from the surface toward the inside in a thickness direction and diffuses in the multi-element layer. In step (ii), a reactive oxygen, nitrogen, and/or carbon are/is used in the absence of a precursor for film formation, to incorporate at least a new additional element, and in some embodiments, the reactive oxygen, nitrogen, and/or carbon are/is an oxygen plasma, nitrogen plasma, and/or carbon plasma, which may be generated by applying RF power to oxygen or ozone for oxidation, to a mixture of nitrogen and hydrogen gases for nitridization, and/or to hydrocarbon gas such as $CH_4$ for carbonization.

In the surface treatment cycle, mainly replacement reaction takes place, and thus, basically, the thickness of the multi-element layer is unchanged. However, since reaction by-products are removed or dissociated from the multi-element layer, typically the thickness of the multi-element layer is reduced by about 1% to about 40% (5%, 10%, 20%, 30%, or values between any two foregoing numbers). However, if oxygen excessively replaces nitrogen, the multi-element layer may expand. In some embodiments, a thickness of the integrated multi-element layer obtained in step (i) is not increased by step (ii).

In some embodiments, the single-phase multi-element film has a dielectric constant of about 5.0 or less (e.g., 4.5 or less, 4.0 or less). Further, the step coverage of the film (percentage of thickness at a sidewall as compared with thickness on a top surface) may be at least 90% (e.g., 93% to 100%). Also, the wet etch rate of the film can be adjusted to a desired level by changing the treatment conditions and the sequence in step (ii). For example, by doping the film with more nitrogen, the wet etch rate of the film is increased.

In some embodiments, the deposition cycle comprises: (ia) supplying a precursor in a pulse to a reaction zone where the substrate is placed; (ib) supplying a reactant gas for deposition and a noble gas continuously to the reaction zone; and (ic) applying RF power to the reaction zone in a pulse after step (ia), and the surface treatment cycle comprises: (iia) continuously supplying the noble gas to the reaction zone; and (iib) supplying a reactant gas for treatment in a pulse to the reaction zone wherein the reactive oxygen, nitrogen, and/or carbon are/is derived from the reactant gas for treatment, wherein neither the precursor nor the reactant gas for deposition is supplied throughout the surface treatment cycle.

In some embodiments, in step (iib), the reactive oxygen, nitrogen, and/or carbon are/is an oxygen plasma, nitrogen plasma, and/or carbon plasma, and the surface treatment cycle further comprises: (iic) applying RF power to the reaction zone in a pulse during step (iib).

In some embodiments, the precursor is constituted by first and second precursors, and step (ia) comprises supplying the first precursor in a pulse and then supplying the second precursor in a pulse.

In some embodiments, the precursor is constituted by first and second precursors, and the deposition cycle further comprises, after conducting steps (ia) to (ic) using the first precursor, conducting steps (ia) to (ic) using the second precursor.

In some embodiments, the precursor is constituted by first and second precursors, and the deposition cycle further comprises, after conducting steps (ia) to (ic) using the first precursor, conducting steps (ia) and (ib) using the second precursor without step (ic).

In some embodiments, the reactant gas for treatment is constituted by first and second reactant gases, and the surface treatment cycle further comprises, after conducting steps (iia) and (iib) using the first reactant gas, conducting steps (iia) and (iib) using the second reactant gas.

In some embodiments, the reactant gas for treatment is constituted by first and second reactant gases, and the surface treatment cycle further comprises, after conducting steps (iia) to (iic) using the first reactant gas, conducting steps (iia) to (iic) using the second reactant gas.

The process sequences according to embodiments are explained below. A skilled artisan will be able to modify these sequences according to the target multi-element film based on this disclosure and routine experimentation. In this disclosure, the word "continuously" refers to at least one of the following: without breaking a vacuum, without being exposed to air, without opening a chamber, as an in-situ process, without interruption as a step in sequence, without changing process conditions, and without causing chemical changes on a substrate surface between steps, depending on the embodiment. In some embodiments, an auxiliary step such as a delay between steps or other step immaterial or insubstantial in the context does not count as a step, and thus, the word "continuously" does not exclude an intervening auxiliary step.

Figure 2:
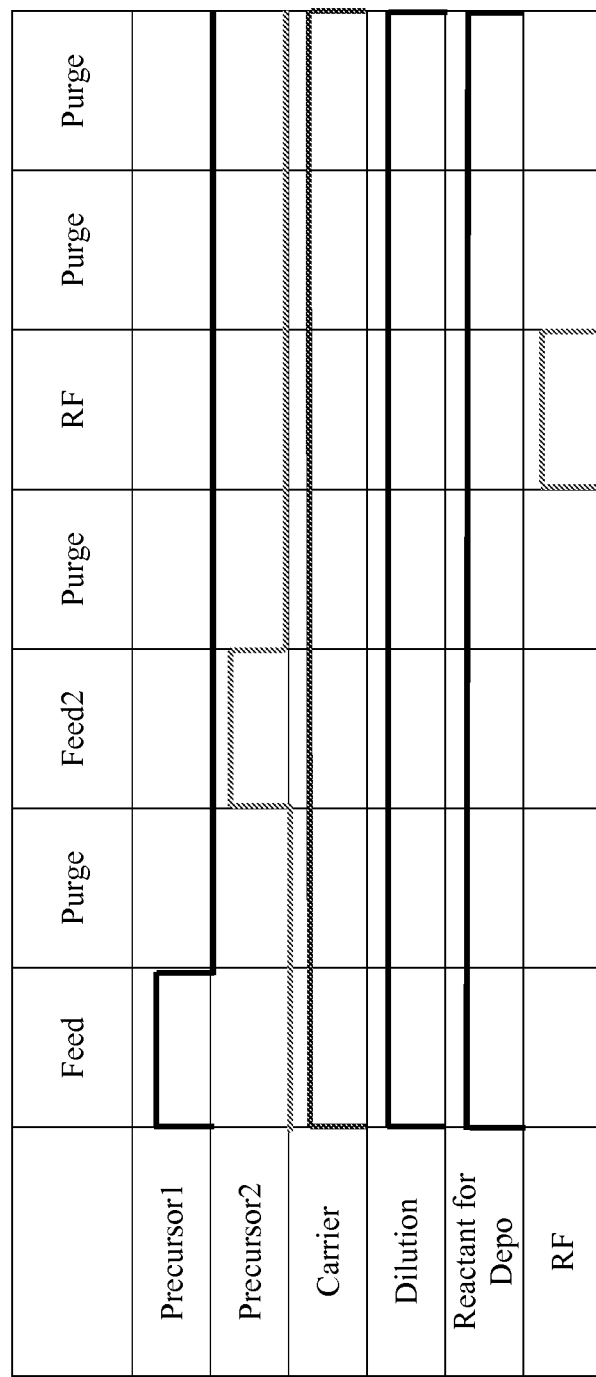
In FIGS. 2-6, the width of each column does not necessarily represent the actual time length, and a raised level of the line in each row represents an ON-state whereas a bottom level of the line in each row represents an OFF-state.

FIG. 2 illustrates a PEALD process sequence according to a comparative example, wherein the width of each column does not necessarily represent the actual time length, and a raised level of the line in each row represents an ON-state whereas a bottom level of the line in each row represents an OFF-state. In this PEALD process, the deposition cycle is repeated, which is constituted by (e.g., consists of) steps of feeding precursor 1 to a reaction zone, purging the reaction zone, feeding precursor 2, purging the reaction zone, applying RF power to the reaction zone, and purging the reaction zone in this order, wherein a carrier gas, dilution gas, and reactant gas for deposition are supplied constantly to the reaction zone throughout the deposition cycle. Since no surface treatment cycle is conducted, a low dielectric constant of the thus-obtained film is not expected.

Figure 3:
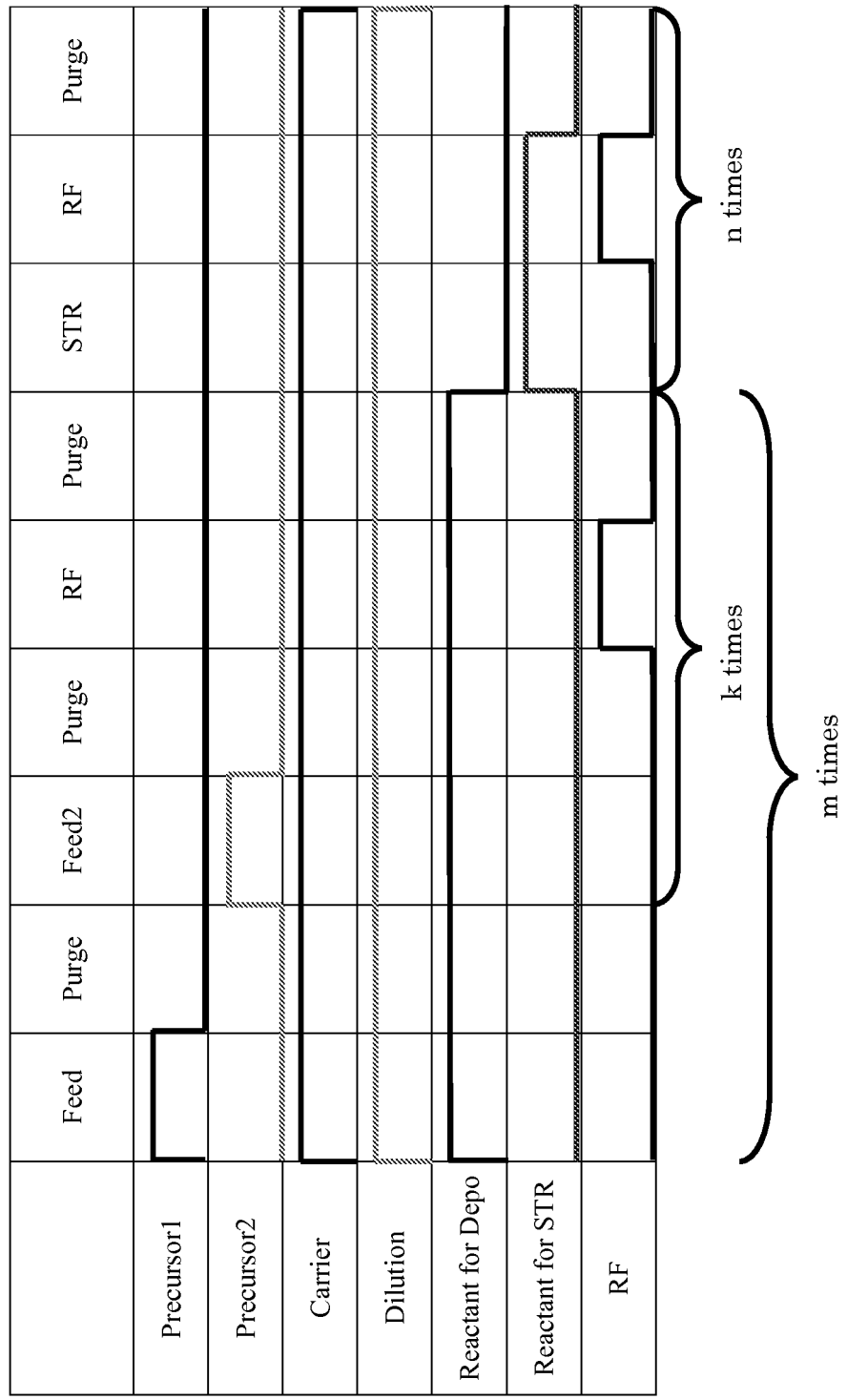

FIG. 3 illustrates a PEALD process sequence according to an embodiment of the present invention. In this PEALD process, the process cycle is constituted by (e.g., consists of) the deposition cycle and the surface treatment cycle. The deposition cycle consists of steps of feeding precursor 1 to a reaction zone, purging the reaction zone, feeding precursor 2, purging the reaction zone, applying RF power to the reaction zone, and purging the reaction zone in this order, wherein a carrier gas, dilution gas, and reactant gas for deposition are supplied continuously to the reaction zone throughout the deposition cycle. In the deposition cycle, steps of feeding precursor 2, purging the reaction zone, applying RF power to the reaction zone, and purging the reaction zone can be repeated k times (k is an integer of 1 to 5, typically 1 to 3), depending on the target compositions and quality of the multi-element film, although repeating is not required. The deposition cycle also can be repeated m times (m is an integer of 1 to 60, typically 1 to 30, e.g., 5 to 20), depending on the target compositions and quality of the multi-element film, although repeating is not required. The surface treatment cycle is conducted continuously after the deposition cycle, which surface treatment cycle is constituted by (e.g., consists of) steps of feeding a reactant for surface treatment ("STR" in the figure) to the reaction zone, applying RF power to the reaction zone, and purging the reaction zone in this order, wherein the carrier gas and dilution gas are supplied continuously to the reaction zone, but the reactant for deposition is not supplied throughout the surface treatment cycle. The surface treatment cycle can be repeated n times (n is an integer of 1 to 10, typically 1 to 3), depending on the target compositions and quality of the multi-element film, although repeating is not required. The process cycle need not be repeated, but is typically repeated multiple times (e.g., 1 to 200 times, typically 1 to 20 times), depending on the target thickness of the multi-element film, the value of m, etc.

Figure 4:
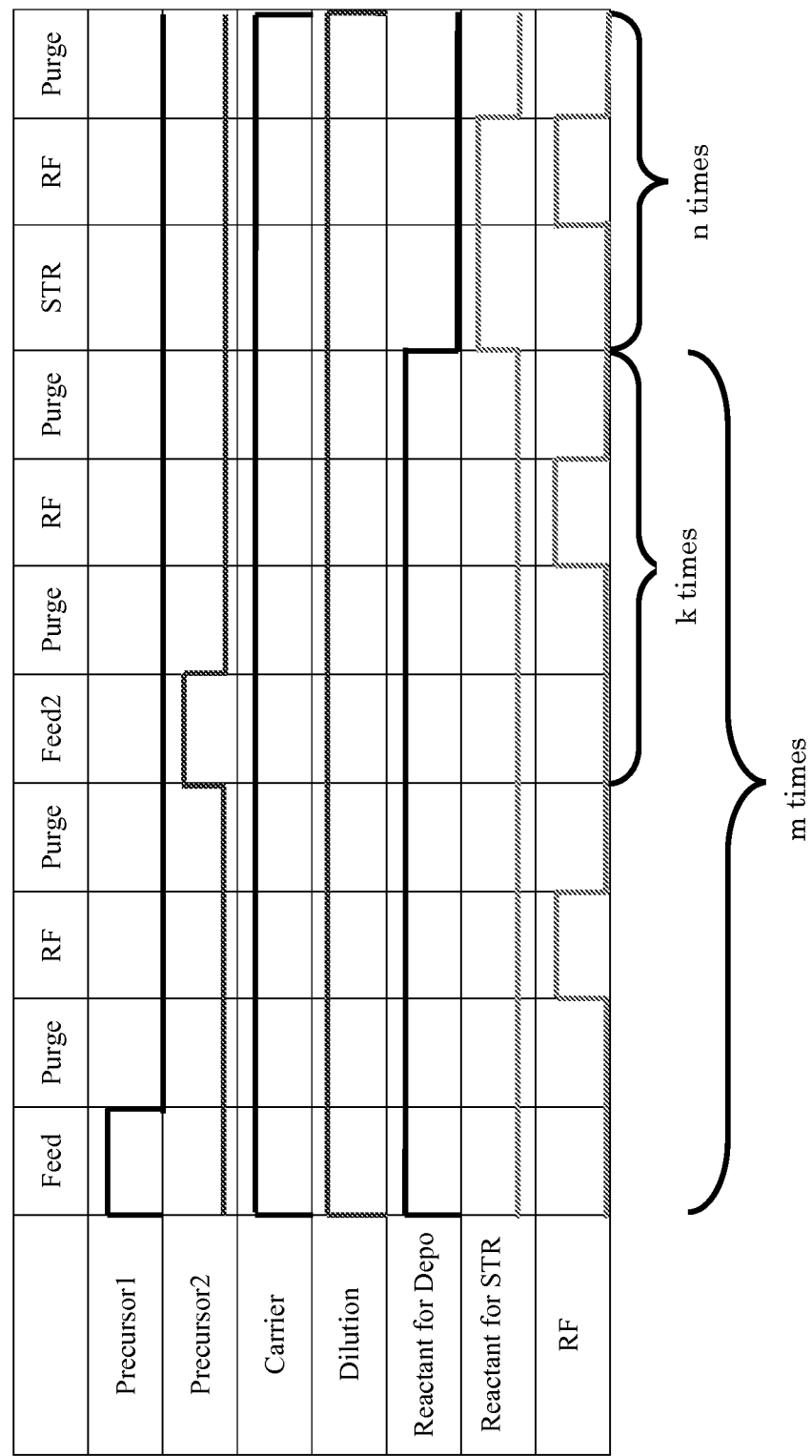

FIG. 4 illustrates a PEALD process sequence according to another embodiment of the present invention. In this PEALD process, the process cycle is constituted by (e.g., consists of) the deposition cycle and the surface treatment cycle. The deposition cycle is constituted by (e.g., consists of) steps of feeding precursor 1 to a reaction zone, purging the reaction zone, applying RF power to the reaction zone, purging the reaction zone, feeding precursor 2 to the reaction zone, purging the reaction zone, applying RF power to the reaction zone, and purging the reaction zone in this order, wherein a carrier gas, dilution gas, and reactant gas for deposition are supplied continuously to the reaction zone throughout the deposition cycle. In the deposition cycle, steps of feeding precursor 2, purging the reaction zone, applying RF power to the reaction zone, and purging the reaction zone can be repeated k times (k is an integer of 1 to 5, typically 1 to 3), depending on the target compositions and quality of the multi-element film, although repeating is not required. The deposition cycle also can be repeated m times (m is an integer of 1 to 40, typically 1 to 20, e.g., 4 to 15), depending on the target compositions and quality of the multi-element film, although repeating is not required. The surface treatment cycle is conducted continuously after the deposition cycle, which surface treatment cycle is constituted by (e.g., consists of) steps of feeding a reactant for surface treatment ("STR" in the figure) to the reaction zone, applying RF power to the reaction zone, and purging the reaction zone in this order, wherein the carrier gas and dilution gas are supplied continuously to the reaction zone, but the reactant for deposition is not supplied throughout the surface treatment cycle. The surface treatment cycle can be repeated n times (n is an integer of 1 to 10, typically 1 to 3), depending on the target compositions and quality of the multi-element film, although repeating is not required. The process cycle need not be repeated, but is typically repeated multiple times (e.g., 1 to 200 times, typically 1 to 20 times), depending on the target thickness of the multi-element film, the value of m, etc.

Figure 5:
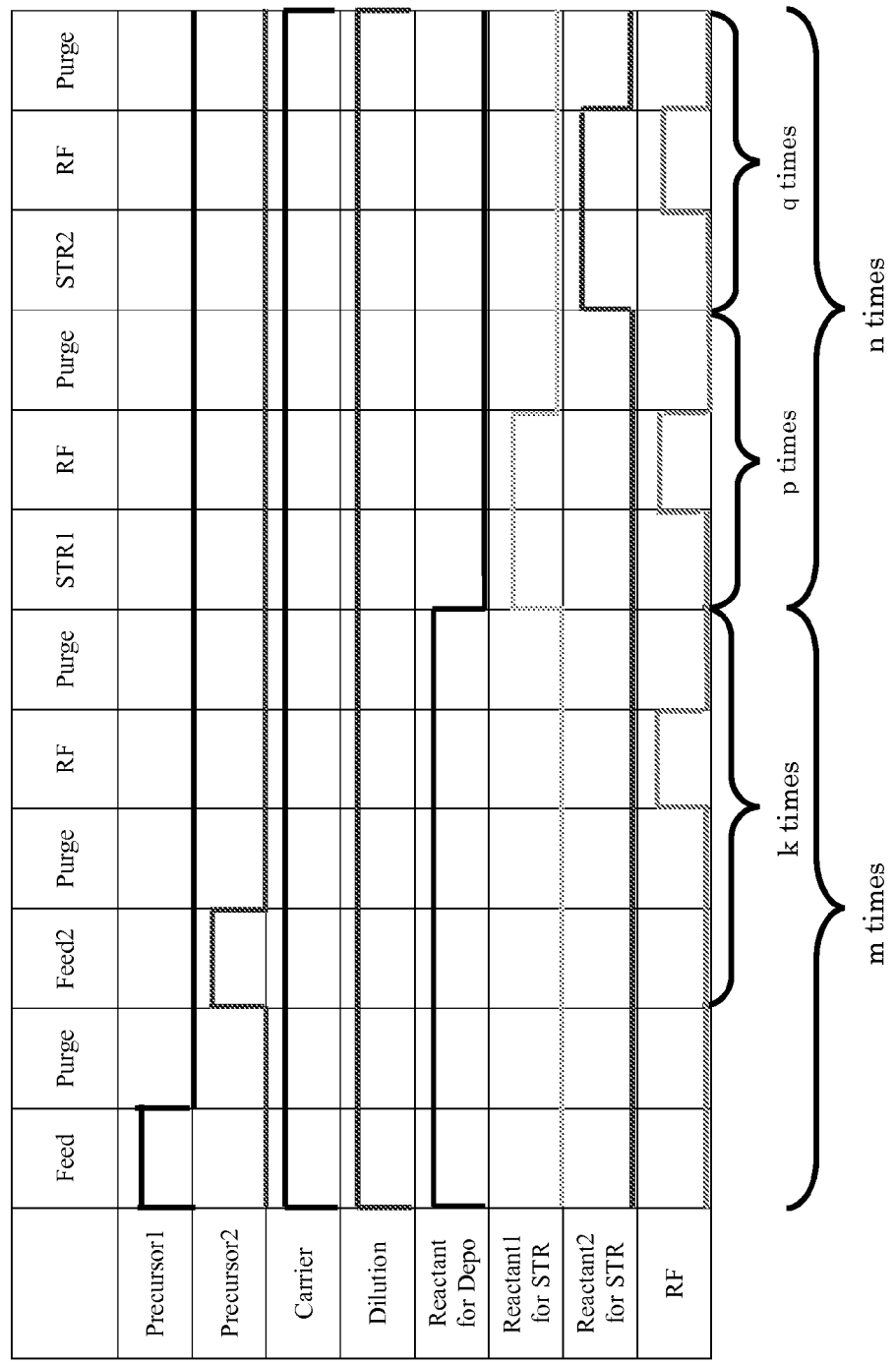

FIG. 5 illustrates a PEALD process sequence according to still another embodiment of the present invention. In this PEALD process, the process cycle is constituted by (e.g., consists of) the deposition cycle and the surface treatment cycle. The deposition cycle is constituted by (e.g., consists of) steps of feeding precursor 1 to a reaction zone, purging the reaction zone, feeding precursor 2 to the reaction zone, purging the reaction zone, applying RF power to the reaction zone, and purging the reaction zone in this order, wherein a carrier gas, dilution gas, and reactant gas for deposition are supplied continuously to the reaction zone throughout the deposition cycle. In the deposition cycle, steps of feeding precursor 2, purging the reaction zone, applying RF power to the reaction zone, and purging the reaction zone can be repeated k times (k is an integer of 1 to 5, typically 1 to 3), depending on the target compositions and quality of the multi-element film, although repeating is not required. The deposition cycle also can be repeated m times (m is an integer of 1 to 60, typically 1 to 30, e.g., 5 to 20), depending on the target compositions and quality of the multi-element film, although repeating is not required. The surface treatment cycle is conducted continuously after the deposition cycle, which surface treatment cycle is constituted by (e.g., consists of) steps of feeding reactant 1 for surface treatment ("STR" in the figure) to the reaction zone, applying RF power to the reaction zone, purging the reaction zone, feeding reactant 2 for surface treatment, applying RF power to the reaction zone, and purging the reaction zone in this order, wherein the carrier gas and dilution gas are supplied continuously to the reaction zone, but the reactant for deposition is not supplied throughout the surface treatment cycle. In the surface treatment cycle, steps of feeding reactant 1 for surface treatment to the reaction zone, applying RF power to the reaction zone, and purging the reaction zone can be repeated p times (p is an integer of 1 to 20, typically 1 to 10), depending on the target compositions and quality of the multi-element film, although repeating is not required. Steps of feeding reactant 2 for surface treatment to the reaction zone, applying RF power to the reaction zone, and purging the reaction zone also can be repeated q times (q is an integer of 1 to 20, typically 1 to 10), depending on the target compositions and quality of the multi-element film, although repeating is not required. The surface treatment cycle can be repeated n times (n is an integer of 1 to 20, typically 1 to 10), depending on the target compositions and quality of the multi-element film, although repeating is not required. The process cycle need not be repeated, but is typically repeated multiple times (e.g., 1 to 200 times, typically 1 to 20 times), depending on the target thickness of the multi-element film, the value of m, etc.

Figure 6:
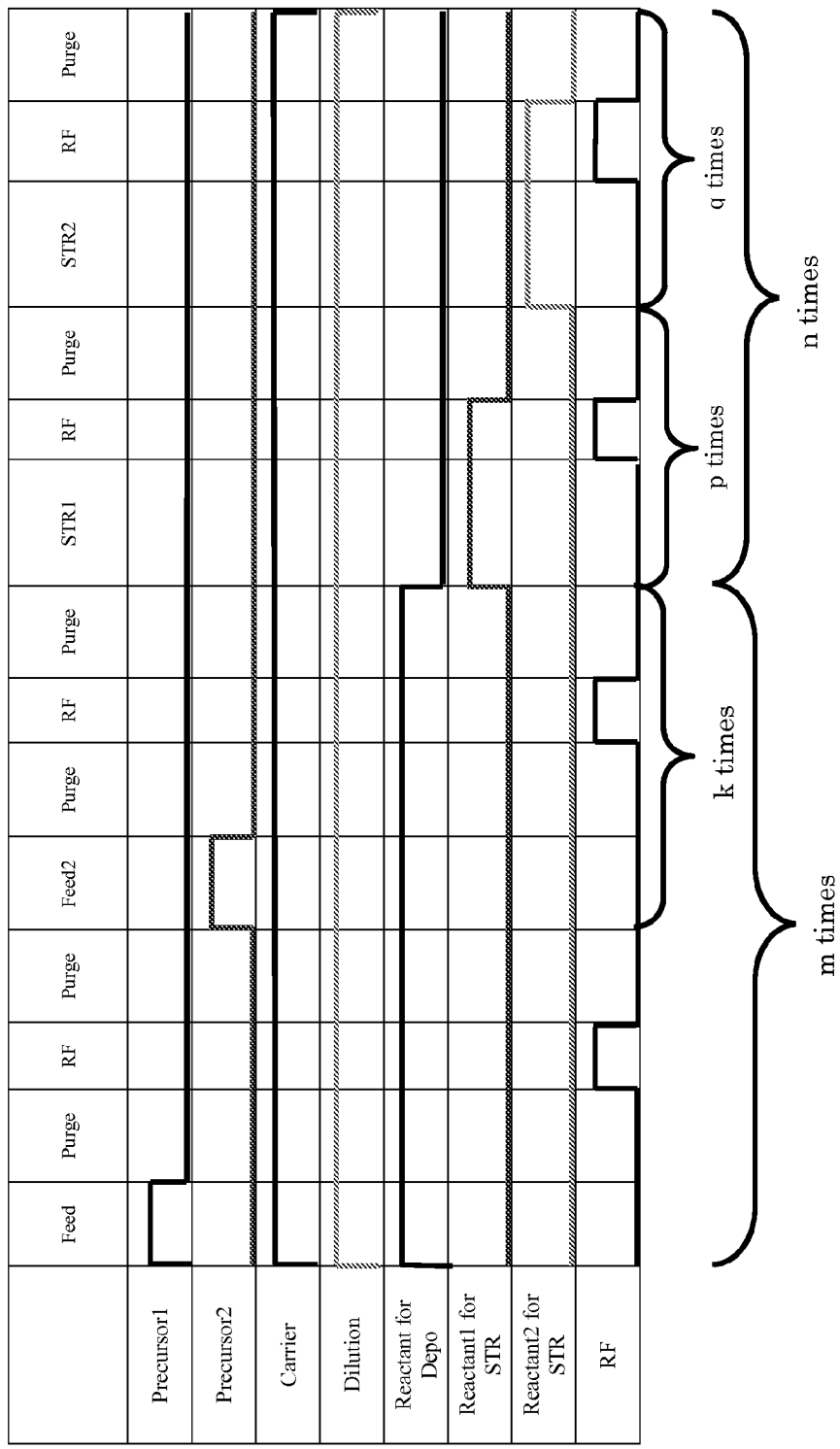

FIG. 6 illustrates a PEALD process sequence according to yet another embodiment of the present invention. In this PEALD process, the process cycle is constituted by (e.g., consists of) the deposition cycle and the surface treatment cycle. The deposition cycle is constituted by (e.g., consists of) steps of feeding precursor 1 to a reaction zone, purging the reaction zone, applying RF power to the reaction zone, purging the reaction zone, feeding precursor 2 to the reaction zone, purging the reaction zone, applying RF power to the reaction zone, and purging the reaction zone in this order, wherein a carrier gas, dilution gas, and reactant gas for deposition are supplied continuously to the reaction zone throughout the deposition cycle. In the deposition cycle, steps of feeding precursor 2, purging the reaction zone, applying RF power to the reaction zone, and purging the reaction zone can be repeated k times (k is an integer of 1 to 5, typically 1 to 3), depending on the target compositions and quality of the multi-element film, although repeating is not required. The deposition cycle also can be repeated m times (m is an integer of 1 to 60, typically 1 to 30, e.g., 5 to 20), depending on the target compositions and quality of the multi-element film, although repeating is not required. The surface treatment cycle is conducted continuously after the deposition cycle, which surface treatment cycle is constituted by (e.g., consists of) steps of feeding reactant 1 for surface treatment ("STR" in the figure) to the reaction zone, applying RF power to the reaction zone, purging the reaction zone, feeding reactant 2 for surface treatment, applying RF power to the reaction zone, and purging the reaction zone in this order, wherein the carrier gas and dilution gas are supplied continuously to the reaction zone, but the reactant for deposition is not supplied throughout the surface treatment cycle. In the surface treatment cycle, steps of feeding reactant 1 for surface treatment to the reaction zone, applying RF power to the reaction zone, and purging the reaction zone can be repeated p times (p is an integer of 1 to 20, typically 1 to 10), depending on the target compositions and quality of the multi-element film, although repeating is not required. Steps of feeding reactant 2 for surface treatment to the reaction zone, applying RF power to the reaction zone, and purging the reaction zone also can be repeated q times (q is an integer of 1 to 10, typically 1 to 3), depending on the target compositions and quality of the multi-element film, although repeating is not required. The surface treatment cycle can be repeated n times (n is an integer of 1 to 10, typically 1 to 3, more typically 1 to 2), depending on the target compositions and quality of the multi-element film, although repeating is not required. The process cycle need not be repeated, but is typically repeated multiple times (e.g., 1 to 200 times, typically 1 to 20 times), depending on the target thickness of the multi-element film, the value of m, etc.

In the sequence illustrated in FIG. 3, in the deposition cycle, application of RF power is conducted once after precursor 2 is fed, and in the surface treatment cycle, only one reactant for surface treatment is used, and thus, the multi-element layer is constituted by a single phase, and doped with one element from the reactant for surface treatment. In the sequence illustrated in FIG. 4, in the deposition cycle, application of RF power is conducted both after precursor 1 is fed and after precursor 2 is fed, and in the surface treatment cycle, only one reactant for surface treatment is used, and thus, the multi-element layer is constituted by a laminate, and doped with one element from the reactant for surface treatment. In the sequence illustrated in FIG. 5, in the deposition cycle, application of RF power is conducted once after precursor 2 is fed, and in the surface treatment cycle, two reactants for surface treatment are used, and thus, the multi-element layer is constituted by a single phase, and doped with two elements from the reactants for surface treatment. In the sequence illustrated in FIG. 6, in the deposition cycle, application of RF power is conducted once after precursor 1 is fed and once after precursor 2 is fed, and in the surface treatment cycle, two reactants for surface treatment are used, and thus, the multi-element layer is constituted by a laminate, and doped with two elements from the reactants for surface treatment. In the sequences illustrated in FIGS. 3-6, reactant 1 and/or reactant 2 for surface treatment can be excited using a remote plasma unit, or can be excited thermally. In the sequences illustrated in FIGS. 3-6, typically, precursor 1 (e.g., silicon-containing material) forms a base matrix of a film, and precursor 2 (e.g., boron-containing material) introduces a dopant into the base matrix of the film, and if a higher content of dopant is desired, the step of feeding precursor 2 is repeated. However, in some embodiments, the order of feeding precursor 1 and precursor 2 can be reversed. Further, although the steps involving precursor 2 are optionally repeated k times in the figures, the steps involving precursor 1 also can be repeated multiple times (e.g., k times independently of the steps involving precursor 2). In the sequences, reactant 1 and/or reactant 2 for surface treatment need not be supplied continuously, but can be supplied only while RF power is applied to the reaction zone. In some embodiments, a time period exclusively designated for purging can be omitted.

In the sequences illustrated in FIGS. 2-6, the precursor is supplied in a pulse using a carrier gas which is continuously supplied. This can be accomplished by, for example, a gas supply system illustrated in FIG. 1B. FIG. 1B illustrates a schematic representation of such a switching flow system. In (a) in FIG. 1B, valves V1 (X) and V2 (R) are closed, and valves V1 (R) and V2 (X) are open, so that a precursor gas flows to a vent via valve V1 (R), and an inactive gas flows to a reactor via valve V2 (X). In (b) in FIG. 1B, by simultaneously closing valves V1 (R) and V2 (X) and opening valves V1 (X) and V2 (R), the precursor gas is instantly directed to flow to the reactor, and the inactive gas is instantly directed to flow to the vent, without substantial changes in the flow rate while maintaining continuous flows. The vent can be set downstream of an exhaust, for example.

In some embodiments, two or more precursors are used, wherein a first precursor provides two or three elements, and a second precursor provides one or two elements, whereas a reactant for surface treatment provides one or two elements. For example, a first precursor includes, but is not limited to, one or more of the following: a silicon-containing halide precursor such as dichlorotetramethyldisilane, tetrachlorodimethyldisilane, and diiodosilane, providing Si, Cl, C, H, and a second precursor includes, but is not limited to, boron-containing gas such as triethylboron and trimethylboron, and arsenic-containing gas such as arsenic triethoxide and trimethylarsine, providing B, As, C, H. The order of feeding precursor 1 and precursor 2 is not limited, and either one can be first. Additionally, in some embodiments, a reactant for surface treatment includes, but is not limited to, one or more of the following: nitridizing gas such as $NH_3$, a mixture of $H_2$ and $N_2$, and hydrazine compound, oxidizing gas such as oxygen, ozone, and carbonic-acid, and carbonizing gas such as $CH_4$ and hexane. A reactant for deposition which can also provide elements can be selected from the above group for a reactant for surface treatment. In some embodiments, a carrier gas and a dilution gas may be selected from one or more of the following: noble gases such as He and Ar, and other inert gases such as $N_2$.

In some embodiments, the deposition cycle may be performed by PEALD, one cycle of which is conducted under conditions shown in Table 1 below.

TABLE 1

(the numbers are approximate)
Conditions for Deposition Cycle

| | |
|---|---|
| Substrate temperature | 0 to 600° C. (preferably 200 to 450° C.) |
| Pressure | 133 to 1000 Pa (preferably 267 to 533 Pa) |
| Precursor 1 | e.g., silicon-containing halide precursor |
| Precursor 1 pulse | 0.1. to 3 sec (preferably 0.1 to 1 sec) |
| Precursor 1 purge | 0.3 to 5 sec (preferably 0.3 to 1 sec) |
| Precursor 2 | e.g., boron-containing gas |
| Precursor 2 pulse | 0.1. to 3 sec (preferably 0.1 to 1 sec) |
| Precursor 2 purge | 0.3 to 5 sec (preferably 0.3 to 1 sec) |
| Reactant | e.g., nitridizing gas |
| Flow rate of reactant (continuous) | 50 to 1000 sccm (preferably 100 to 500 sccm) |
| Carrier gas | e.g., noble gas |
| Dilution gas | e.g., noble gas |
| Flow rate of carrier gas (continuous) | 1000 to 4000 sccm (preferably 1500 to 2000 sccm) |
| Flow rate of dilution gas (continuous) | 50 to 2000 sccm (preferably 500 to 1000 sccm) |
| RF power (13.56 MHz) for a 300-mm wafer | 50 to 1000 W (preferably 50 to 300 W) |
| RF power pulse | 0.3 to 20 sec (preferably 0.5 to 5 sec) |
| Purge | 0.1 to 1 sec (preferably 0.1 to 0.5 sec) |
| Growth rate per cycle | 0.06 to 0.15 nm/cycle (preferably 0.07 to 0.1 nm/cycle) |

The precursor may be provided with the aid of a carrier gas. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. A plasma for deposition may be generated in situ, for example, in an ammonia gas that flows continuously throughout the deposition cycle. In other embodiments the plasma may be generated remotely and provided to the reaction chamber.

As mentioned above, each pulse or phase of each deposition cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface.

In some embodiments, the ALD cycle disclosed in US 2009/0209081 A1 and US 2013/0084714 A1, each disclosure of which is incorporated by reference in its entirety can be employed for forming a multi-element layer by a deposition cycle.

In some embodiments, the multi-element layer is treated with a surface treating gas (reactant) in the surface treatment cycle under conditions shown in Table 2 below.

TABLE 2

(the numbers are approximate)
Conditions for Surface Treatment Cycle

| | |
|---|---|
| Susceptor temperature | Same as in deposition cycle |
| Pressure | Same as in deposition cycle |
| Reactant gas | e.g., nitridizing gas, oxidizing gas, carbonizing gas |
| Flow rate of reactant gas | 10 to 1000 sccm (preferably 10 to 300 sccm) |
| Carrier gas (continuous) | Same as in deposition cycle |
| Dilution gas (continuous) | Same as in deposition cycle |
| RF power (13.56 MHz) for a 300-mm wafer | 50 to 500 W (preferably 50 to 200 W) |
| RF power pulse | 0.5 to 10 sec (preferably 0.1 to 3 sec) |
| Purge | 0.1 to 10-sec (preferably 0.1 to 5 sec) |

Figure 1B:
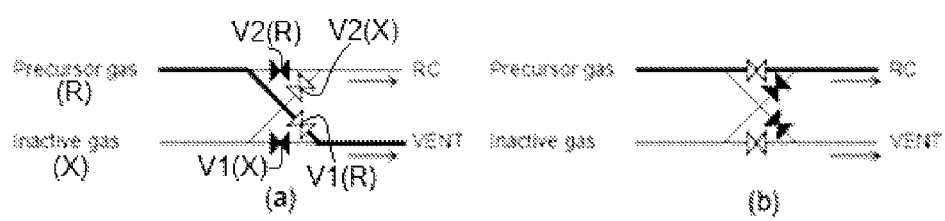
FIG. 1B illustrates a schematic representation of switching flow of an inactive gas and flow of a precursor gas usable in an embodiment of the present invention.

The process cycle can be performed using any suitable apparatus including an apparatus illustrated in FIG. 1A, for example. FIG. 1A is a schematic view of a PEALD apparatus, desirably in conjunction with controls programmed to conduct the sequences described below, usable in some embodiments of the present invention. In this figure, by providing a pair of electrically conductive flat-plate electrodes 4, 2 in parallel and facing each other in the interior 11 of a reaction chamber 3, applying HRF power (13.56 MHz or 27 MHz) 5 and LRF power (5 MHz or less, 400 kHz-500 kHz) 50 to one side, and electrically grounding 12 to the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided, through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). In some embodiments, the deposition of multi-element film and surface treatment are performed in the same apparatus such as that described above, so that all the steps can continuously be conducted without exposing the substrate to air or other oxygen-containing atmosphere. In some embodiments, a remote plasma unit can be used for exciting a gas.

In some embodiments, in the apparatus depicted in FIG. 1A, in place of the pulse flow control valve 31, the system of switching flow of an inactive gas and flow of a precursor gas illustrated in FIG. 1B (described earlier), can be used.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

EXAMPLES

A multi-element dielectric film was formed on a Si substrate (0300 mm) having trenches with an aspect ratio of 3 (a width of 35 nm) by PEALD, one cycle of which was conducted under the common conditions shown in Table 3 (deposition cycle) and Table 4 (surface treatment cycle) below using the PEALD apparatus illustrated in FIG. 1A (including a modification illustrated in FIG. 1B) with the specific conditions and sequence indicated in Table 5 wherein "DCTDMS" represents dichlorotetradimehylsilane, "BT" represents boron triethyl, and "DIS" represents diiodosilane.

TABLE 3

(the numbers are approximate)
Common Conditions for Deposition Cycle

| | |
|---|---|
| Substrate temperature | 400° C. |
| Pressure | 400 Pa |
| Carrier gas | Ar |
| Dilution gas | Ar |
| Flow rate of carrier gas (continuous) | 2000 sccm |
| Flow rate of dilution gas (continuous) | 500 sccm |
| RF power pulse | 1 sec |
| Purge | 0.5 sec |

TABLE 4

(the numbers are approximate)
Common Conditions for Surface Treatment Cycle

| | |
|---|---|
| Substrate temperature | Same as in deposition cycle |
| Pressure | Same as in deposition cycle |
| Carrier gas (continuous) | Same as in deposition cycle |
| Dilution gas (continuous) | Same as in deposition cycle |
| Purge | 5 sec |

TABLE 5

(the numbers are approximate)

| | Precursor | Reactant for deposition (flow rate) | RF [W] | Reactant for surface treatment (flow rate; duration) | Cycle ratio of deposition to surface treatment (number of process cycle) | Sequence |
|---|---|---|---|---|---|---|
| *1 | $1^{st}$: DCTDMS<br>$2^{nd}$: BT | NH3 (2 slm) | 200 | — | — | FIG. 2 |
| *2 | $1^{st}$: DCTDMS<br>$2^{nd}$: BT | H2/N2<br>(0.25/1 slm) | 100 | — | — | FIG. 2 |
| 3 | $1^{st}$: DCTDMS<br>$2^{nd}$: BT | NH3 (2 slm) | 200 | O2 (20 sccm;<br>0.5 s) | 20:1<br>(10) | FIG. 3<br>k = 1/m = 20/n = 1 |
| 4 | $1^{st}$: DCTDMS<br>$2^{nd}$: BT | NH3 (2 slm) | 200 | O2 (20 sccm;<br>0.5 s) | 15:1<br>(13) | FIG. 4<br>k = 1/m = 15/n = 1 |
| 5 | $1^{st}$: DCTDMS<br>$2^{nd}$: BT | NH3 (2 slm) | 200 | O2 (20 sccm;<br>0.2 s) | 20:1<br>(10) | FIG. 3<br>k = 1/m = 20/n = 1 |
| 6 | $1^{st}$: DCTDMS<br>$2^{nd}$: BT | NH3 (2 slm) | 200 | O2 (20 sccm;<br>1 s) | 20:1<br>(10) | FIG. 3<br>k = 1/m = 20/n = 1 |
| 7 | $1^{st}$: DCTDMS<br>$2^{nd}$: BT | NH3 (2 slm) | 200 | $1^{st}$: O2 (20 sccm; 0.3 s)<br>$2^{nd}$: Diethylamine (5 sccm; 0.5 s) | 20:1<br>(10) | FIG. 5<br>k = 1/m = 20/n = 1/<br>p = 1/q = 1 |
| 8 | $1^{st}$: DIS<br>$2^{nd}$: BT | H2/N2<br>(0.25/1 slm) | 100 | O2 (20 sccm;<br>0.5 s) | 20:1<br>(10) | FIG. 3<br>k = 1/m = 20/n = 1 |
| 9 | $1^{st}$: DIS<br>$2^{nd}$: BT | H2/N2<br>(0.25/1 slm) | 100 | O2 (20 sccm;<br>0.2 s) | 20:1<br>(10) | FIG. 3<br>k = 1/m = 20/n = 1 |
| 10 | $1^{st}$: DCTDMS<br>$2^{nd}$: BT | H2/N2<br>(0.25/1 slm)<br>↓<br>N2 (1 slm) | 100 | O2 (20 sccm;<br>0.5 s) | 20:1<br>(10) | FIG. 3<br>k = 1/m = 20/n = 1 |
| *11 | $1^{st}$: DIS<br>$2^{nd}$: BT | H2/N2<br>(0.25/1 slm) | 100 | O2 (20 sccm;<br>10 min) | 200:1<br>(1) | FIG. 3<br>k = 1/m = 200/n = 1 |
| *12 | $1^{st}$: DIS<br>$2^{nd}$: BT | H2/N2<br>(0.25/1 slm) | 100 | O2 (20 sccm;<br>20 mm) | 200:1<br>(1) | FIG. 3<br>k = 1/m = 200/n = 1 |
| *13 | $1^{st}$: DIS<br>$2^{nd}$: BT | H2/N2<br>(0.25/1 slm) | 100 | N2 (1000<br>sccm; 0.2 s) | 20:1<br>(10) | FIG. 3<br>k = 1/m = 20/n = 1 |
| 14 | $1^{st}$: DIS<br>$2^{nd}$: BT | H2/N2<br>(0.25/1 slm) | 100 | CH4 (500<br>sccm; 0.2 s) | 20:1<br>(10) | FIG. 3<br>k = 1/m = 20/n = 1 |

In Table 5, the Example numbers with "*" indicate comparative examples. "Cycle ratio of deposition to surface treatment" represents a cycle ratio of the number of deposition cycles repeated to the number of surface treatment cycles repeated. The RF power applied during the deposition cycle and the surface treatment cycle was the same. Each obtained film was evaluated. Table 6 shows the results of evaluation.

TABLE 6

(the numbers are approximate)

| | GPC (nm/cycle) | RI @633 nm | K-Value | Leakage Current (A/cm2) | 100:1 DHF WERR@TOX | Step Coverage @AR3 (%) | Film |
|---|---|---|---|---|---|---|---|
| *1 | 0.1 | 1.80 | 5.3 | 3E-9 | 0.5 | 92 | SiBNH |
| *2 | 0.11 | 1.78 | 5.0 | 6E-9 | 0.3 | 90 | SiBNH |
| 3 | 0.085 | 1.62 | 4.0 | 8E-9 | 2 | 93 | SiBONH |
| 4 | 0.075 | 1.55 | 3.7 | 1E-8 | 1.8 | 94 | SiBONH |
| 5 | 0.095 | 1.7 | 4.3 | 4E-9 | 0.9 | 93 | SiBONH |
| 6 | 0.075 | 1.49 | 3.5 | 2E-8 | 5 | 95 | SiBONH |
| 7 | 0.08 | 1.85 | 4.1 | 6E-9 | 0.3 | 95 | SiBOCNH |
| 8 | 0.095 | 1.65 | 4.0 | 8E-9 | 2 | 94 | SiBONH |
| 9 | 0.099 | 1.71 | 4.3 | 5E-9 | 0.9 | 97 | SiBONH |
| 10 | 0.085 | 1.74 | 4.1 | 5E-9 | 0.5 | 94 | SiBONH |
| *11 | 0.092 | 1.71 | 4.4 | 3E-8 | 0.8 | 97 | SiBONH |
| *12 | 0.097 | 1.61 | 3.8 | 1E-9 | 1.2 | 95 | SiBONH |
| *13 | 0.05 | 1.99 | 5.5 | 1E-8 | 0.2 | 93 | SiBNH |
| 14 | 0.06 | 2.21 | 4.8 | 9E-9 | 0.1 | 90 | SiBCNH |

In Table 6, "GPC" represents growth rate per cycle, "RI@633 nm" represents refractive index at a wavelength of 633 nm, "K-Value" represents dielectric constant, "100:1 DHF WERR@TOX" represents wet etch rate using a diluted HF solution at a 1% concentration relative to that of thermal oxide film, "Step Coverage@AR3" represents a step coverage at a trench having an aspect ratio of 3, and "Film" represents compositions of the film.

In Examples 3-12, the surface treatment cycle was conducted in order to incorporate oxygen into a layer of SiBNH obtained by the deposition cycle, so as to produce a layer of SiBONH. For example, it was confirmed that the multi-element film obtained in Example 3 had the compositions shown in Table 7 below, as a result of composition analysis by Rutherford backscattering Spectrometry (RBS) and Hydrogen Forward Scattering (HFS). Note that although the compositions of the films are expressed as SiBNH or SiBONH in Table 6 above, it was confirmed that the films also contained carbon in an amount of approximately 5 atomic % (or less) based on Secondary Ion Mass Spectrometry (SIMS).

In a manner similar to that in Examples 2-12, other multi-element films comprising two metalloid elements can be formed. Also, if three precursors are used, each providing a different metalloid element, multi-element films comprising three metalloid elements can be formed. A skilled artisan in the art can readily provide conditions and/or structures for forming such multi-element films, in view of the present disclosure, as a matter of routine experimentation.

TABLE 7

(the numbers are approximate)

| Example | Si (at %) | N (at %) | H (at %) | O (at %) | B (at %) |
|---|---|---|---|---|---|
| 3 | 15 | 35 | 10 | 20 | 20 |

Further, in Examples 3-10, oxygen is expected to have been incorporated and diffused uniformly throughout the film as being evident from the composition analysis of the film obtained in Example 11. The results of composition analysis by Rutherford backscattering Spectrometry (RBS) and Hydrogen Forward Scattering (HFS) of the film of Example 11 are shown in Table 8 below. That is, the film was fully doped with oxygen from the surface to a depth of 10 nm, but was not doped with oxygen at a depth of deeper than 10 nm. The thickness of the layer obtained by each deposition cycle in Examples 3-10 can be calculated as follows (the numbers are approximate): 1.7 nm (Example 3), 1.1 nm (Example 4), 1.9 nm (Example 5), 1.5 nm (Example 6), 1.6 nm (Example 7), 1.9 nm (Example 8), 2.0 nm (Example 9), and 1.7 nm (Example 10). Thus, it is expected that the multi-element films obtained in Examples 3-10 were constituted by compositions substantially uniformly distributed throughout the films.

TABLE 8

(the numbers are approximate)

| | RBS-HFS Composition (at %) | | | | |
|---|---|---|---|---|---|
| Example 11 | Si | N | H | O | B |
| SiBN + O2 Plasma Surface⇒ 10 nm | 16.0 | 36.0 | 10.0 | 28.0 | 10.0 |
| 10 nm⇒ 100 nm | 15.0 | 55.0 | 10.0 | 0.0 | 20.0 |

In Examples 3 and 5-10, the cycle ratio of the number of deposition cycles repeated to the number of surface treatment cycles repeated was 20:1. In Example 4, the cycle ratio was 15:1. By reducing the cycle ratio (i.e., by conducting a surface treatment cycle at fewer intervals or more frequently relative to a deposition cycle), the dielectric constant of the film can be reduced as being evident from Example 4 (k=3.7) as compared with Example 3 (k=4.0). Further, by adjusting the duration of a surface treatment cycle, the dielectric constant of the film can also be adjusted. For example, in Example 5, the duration was 40% of that in Example 3, and as a result, the dielectric constant was increased to 4.3 in Example 5 as compared with 4.0 in Example 3. On the other hand, in Example 6, the duration was 200% of that in Example 3, and as a result, the dielectric constant was decreased to 3.5 in Example 6 as compared with 4.0 in Example 3.

In general, when a film has a low dielectric constant, the film tends to have a high wet etch rate (less resistant to chemicals), i.e., dielectric constant and wet etch rate are in a trade-off relationship. However, by doping the film with carbon, it is possible to significantly lower wet etch rate while avoiding significantly increasing dielectric constant. For example, in Example 6, the dielectric constant of the film was 3.5 and the wet etch rate relative to thermal oxide film was 5, but in Example 7 where the film was doped with carbon by using diethylamine gas upon exposure to oxygen plasma in each surface treatment cycle, the wet etch rate relative to thermal oxide film was drastically improved to 0.3 (about 16 times less than that in Example 6) while suppressing an increase of dielectric constant to about 17% or a dielectric constant of 4.1. Thus, by controlling surface treatment cycles (the type of dopant used in the cycle, the number of the cycles repeated, the process conditions for the cycle, and/or the duration of the cycle), the compositions and properties of a multi-element film can be adjusted.

Further, all of the films had a step coverage of 90% or higher, indicating that adsorption hindrance or adsorption interference of precursors did not occur.

Additionally, in place of the oxygen plasma in Examples 3-10, a nitrogen plasma was used in the surface treatment cycle in Example 11 (no new element was added by the surface treatment cycle), and a hydrocarbon plasma was used in the surface treatment cycle in Example 12 (a new element which was carbon was added by the surface treatment cycle). As a result, in Example 11 (nitriding), the RI was increased approximately twofold as compared with that in Example 2, but the dielectric constant was increased to 5.5 which exceeded 5.0. In Example 12 (carbonizing), the RI was increased to 2.2, and the wet etch rate relative to thermal oxide film was 0.1 while the dielectric constant was 4.8 which was less than 5.0, indicating that the concentration of carbon incorporated into the film was significantly increased.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a single-phase multi-element film constituted by at least four elements on a substrate by plasma-enhanced atomic layer deposition (PEALD) conducting one or more process cycles, each process cycle comprising:
   (i) forming an integrated multi-element layer constituted by at least three elements on a substrate by PEALD using at least one precursor; and
   (ii) treating a surface of the integrated multi-element layer with a reactive oxygen, nitrogen, and/or carbon in the absence of a precursor for film formation so as to incorporate at least one new additional element selected from oxygen, nitrogen, and carbon into the integrated multi-element layer.

2. The method according to claim 1, wherein step (i) is conducted in each process cycle to the extent that a thickness of the integrated multi-element layer does not exceed 15 nm.

3. The method according to claim 1, wherein step (ii) is conducted in each process cycle to the extent that the at least one new additional element is diffused throughout the integrated multi-element layer.

4. The method according to claim 1, wherein step (i) in each process cycle is constituted by a deposition cycle of PEALD, and step (ii) in each process cycle is constituted by a surface treatment cycle, wherein a cycle ratio of the number of the deposition cycles to the number of the surface treatment cycles in each process cycle is 1/10 to 60/1.

5. The method according to claim 1, wherein the multi-element film is constituted by five elements.

6. The method according to claim 1, wherein the reactive oxygen, nitrogen, and/or carbon are/is an oxygen plasma, nitrogen plasma, and/or carbon plasma.

7. The method according to claim 1, wherein the at least four elements are selected from the group consisting of metalloid elements and nonmetal elements.

8. The method according to claim 7, wherein the metalloid element is silicon.

9. The method according to claim 7, wherein the at least four elements include two or more metalloid elements, and in step (i), the multi-element layer is deposited using two or more precursors each containing a different metalloid element.

10. The method according to claim 8, wherein the single-phase multi-element film is a film of SiBCNH, SiBOCNH, SiCNH, SiOCNH, SiOCH, SiPNH, SiPOCNH, BCONH, PCONH, AsCONH, BCNH, PCNH, or AsCNH.

11. The method according to claim 1, wherein the single-phase multi-element film has a dielectric constant of about 5.0 or less.

12. The method according to claim 1, wherein a thickness of the integrated multi-element layer obtained in step (i) is not increased by step (ii).

13. The method according to claim 1, wherein steps (i) and (ii) are conducted at a temperature of about 0° C. to about 600° C.

14. The method according to claim 4, wherein:
   the deposition cycle comprises: (ia) supplying a precursor in a pulse to a reaction zone where the substrate is placed; (ib) supplying a reactant gas for deposition and a noble gas continuously to the reaction zone; and (ic) applying RF power to the reaction zone in a pulse after step (ia), and
   the surface treatment cycle comprises: (iia) continuously supplying the noble gas to the reaction zone; and (iib) supplying a reactant gas for treatment in a pulse to the reaction zone wherein the reactive oxygen, nitrogen, and/or carbon are/is derived from the reactant gas for treatment, wherein neither the precursor nor the reactant gas for deposition is supplied throughout the surface treatment cycle.

15. The method according to claim 14, wherein in step (iib), the reactive oxygen, nitrogen, and/or carbon are/is an oxygen plasma, nitrogen plasma, and/or carbon plasma, and the surface treatment cycle further comprises: (iic) applying RF power to the reaction zone in a pulse during step (iib).

16. The method according to claim 14, wherein the precursor is constituted by first and second precursors, and step (ia) comprises supplying the first precursor in a pulse and then supplying the second precursor in a pulse.

17. The method according to claim 14, wherein the precursor is constituted by first and second precursors, and the deposition cycle further comprises, after conducting steps (ia) to (ic) using the first precursor, conducting steps (ia) to (ic) using the second precursor.

18. The method according to claim 14, wherein the precursor is constituted by first and second precursors, and the deposition cycle further comprises, after conducting steps (ia) to (ic) using the first precursor, conducting steps (ia) and (ib) using the second precursor without step (ic).

19. The method according to claim 14, wherein the reactant gas for treatment is constituted by first and second reactant gases, and the surface treatment cycle further comprises, after conducting steps (iia) and (iib) using the first reactant gas, conducting steps (iia) and (iib) using the second reactant gas.

20. The method according to claim 15, wherein the reactant gas for treatment is constituted by first and second reactant gases, and the surface treatment cycle further comprises, after conducting steps (iia) to (iic) using the first reactant gas, conducting steps (iia) to (iic) using the second reactant gas.

* * * * *